United States Patent
Athanasiou et al.

(10) Patent No.: US 10,096,708 B2
(45) Date of Patent: Oct. 9, 2018

(54) ENHANCED SUBSTRATE CONTACT FOR MOS TRANSISTOR IN AN SOI SUBSTRATE, IN PARTICULAR AN FDSOI SUBSTRATE

(71) Applicant: STMicroelectronics SA, Montrouge (FR)

(72) Inventors: Sotirios Athanasiou, Grenoble (FR); Philippe Galy, Le Touvet (FR)

(73) Assignee: STMicroelectronics SA, Montrouge (FR)

( * ) Notice: Subject to any disclaimer, the term of this patent is extended or adjusted under 35 U.S.C. 154(b) by 67 days.

(21) Appl. No.: 15/230,699

(22) Filed: Aug. 8, 2016

(65) Prior Publication Data

US 2017/0288059 A1   Oct. 5, 2017

(30) Foreign Application Priority Data

Mar. 30, 2016   (FR) ...................... 16 52717

(51) Int. Cl.
*H01L 29/78* (2006.01)
*H01L 27/12* (2006.01)
*H01L 23/528* (2006.01)
*H01L 21/84* (2006.01)
*H01L 29/66* (2006.01)
(Continued)

(52) U.S. Cl.
CPC ........ *H01L 29/7838* (2013.01); *H01L 21/743* (2013.01); *H01L 21/84* (2013.01); *H01L 23/528* (2013.01); *H01L 27/1203* (2013.01); *H01L 29/66772* (2013.01); *H01L 29/78* (2013.01); *H01L 29/78615* (2013.01)

(58) Field of Classification Search
None
See application file for complete search history.

(56) References Cited

U.S. PATENT DOCUMENTS

| | | |
|---|---|---|
| 5,164,805 A | 11/1992 | Lee |
| 5,573,961 A | 11/1996 | Hsu et al. |
| 5,637,899 A | 6/1997 | Eimori et al. |

(Continued)

FOREIGN PATENT DOCUMENTS

JP   2004063600 A   2/2004

OTHER PUBLICATIONS

Galy, Philippe, et al: "BIMOS Transistor in Thin Silicon Film and New Solutions for ESD Protection in FDSOI UTBB CMOS Technology," EUROSOI-ULIS 2015, 2015 IEEE, pp. 29-32.

(Continued)

*Primary Examiner* — Charles Garber
*Assistant Examiner* — Alia Sabur
(74) *Attorney, Agent, or Firm* — Crowe & Dunlevy

(57) ABSTRACT

An integrated electronic device includes a semiconductive film above a buried insulating layer that is situated above a supporting substrate. An active zone is delimited within the semiconductive film. A MOS transistor supported within the active zone includes a gate region situated above the active zone. The gate region includes a rectilinear part situated between source and drain regions. The gate region further includes a forked part extending from the rectilinear part. A raised semiconductive region situated above the active zone is positioned at least partly between portions of the forked part. A substrate contact for the transistor is electrically coupled to the raised semiconductive region.

17 Claims, 3 Drawing Sheets

(51) Int. Cl.
*H01L 21/74* (2006.01)
*H01L 29/786* (2006.01)

(56) References Cited

U.S. PATENT DOCUMENTS

| | | | |
|---|---|---|---|
| 6,387,739 | B1 | 5/2002 | Smith, III |
| 7,084,462 | B1 | 8/2006 | Warnock et al. |
| 9,019,666 | B2 | 4/2015 | Bourgeat et al. |
| 9,716,136 | B1* | 7/2017 | Abou-Khalil ............ H01L 28/20 |
| 9,837,413 | B2 | 12/2017 | Galy et al. |
| 2002/0027246 | A1 | 3/2002 | Kunikiyo |
| 2003/0155615 | A1 | 8/2003 | Yoshida et al. |
| 2004/0036118 | A1 | 2/2004 | Abadeer et al. |
| 2005/0184341 | A1* | 8/2005 | Wei .................. H01L 29/78603 257/347 |
| 2008/0290413 | A1 | 11/2008 | Mandelman et al. |
| 2009/0283832 | A1* | 11/2009 | Sugiura ............... H01L 27/0248 257/355 |
| 2011/0031552 | A1 | 2/2011 | Iwamatsu et al. |
| 2012/0205744 | A1 | 8/2012 | O et al. |
| 2013/0141824 | A1* | 6/2013 | Bourgeat ................ H01L 23/60 361/56 |
| 2014/0346601 | A1* | 11/2014 | Sugiura .................. H01L 29/78 257/347 |

OTHER PUBLICATIONS

Cristoloveanu, Sorin et al: "A Review of Electrical Characterization Techniques for Ultrathin FDSOI Material and Devices," Solid-State Electronics 117, 2016 (pp. 10-36).

Lim, Hyung-Kyu et al: "Threshold Voltage of Thin-Film Silicon on Insulator (SOI) MOSFETs," IEEE Transactions on Electron Devices, vol. ED-30, No. 10, Oct. 1983 (pp. 1244-1251).

INPI Search Report and Written Opinion for FR 1652717 dated Nov. 30, 2016 (7 pages).

* cited by examiner

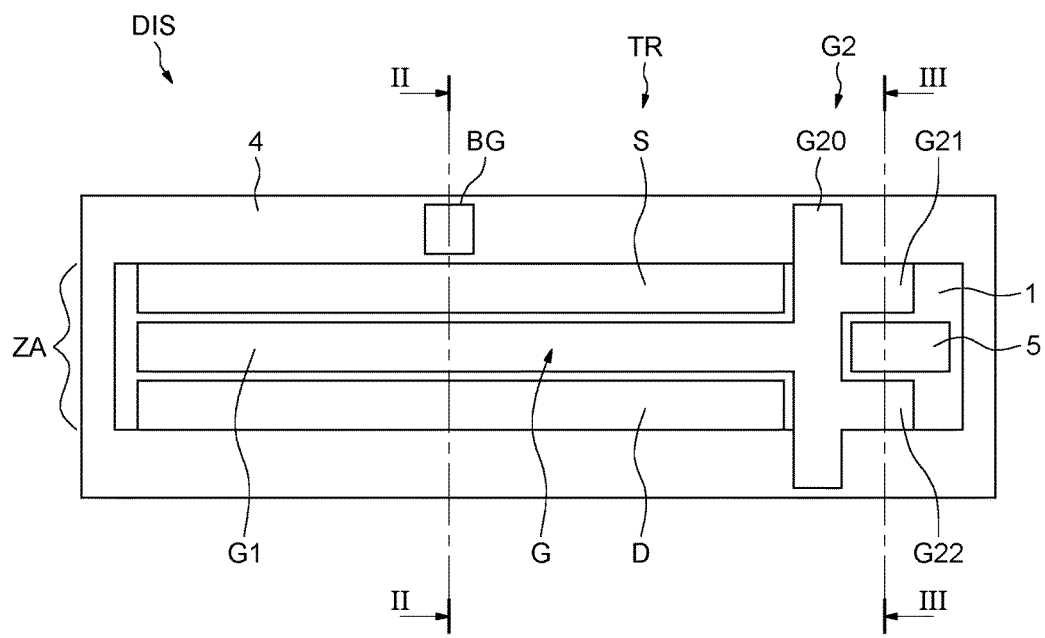
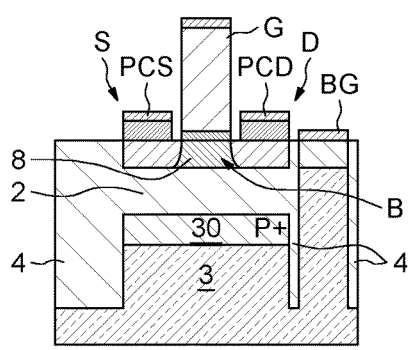 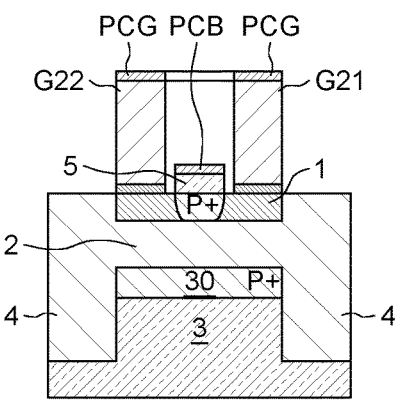

US 10,096,708 B2

ENHANCED SUBSTRATE CONTACT FOR MOS TRANSISTOR IN AN SOI SUBSTRATE, IN PARTICULAR AN FDSOI SUBSTRATE

PRIORITY CLAIM

This application claims priority from French Application for Patent No. 1652717 filed Mar. 30, 2016, the disclosure of which is incorporated by reference.

TECHNICAL FIELD

Embodiments relate to integrated circuits and more particularly MOS transistors with hybrid operation produced on substrates of silicon on insulator type, commonly referred to by those skilled in the art by the acronym "SOI", in particular a substrate of the fully depleted silicon on insulator type, known to those skilled in the art by the acronym "FDSOI".

BACKGROUND

MOS transistors with hybrid operation are known, which are of interest notably for electrostatic discharge (ESD) protection applications. A person skilled in the art will for example be able to refer to U.S. Pat. No. 9,019,666 (incorporated by reference) which describes this type of transistor.

These transistors are produced on bulk substrates. Now, electrical simulations have shown (see, for example, Galy, et al., "BIMOS transistor in thin silicon film and new solutions for ESD protection in FDSOI UTBB CMOS technology", EUROSOI-ULIS 2015, 26-28 Jan. 2015, Bologna, Italy (incorporated by reference)), that there would be advantages from an electrical point of view in producing these transistors with hybrid operation on a substrate of FDSOI type for an ESD protection application.

However, the very small thickness of the semiconductive film (typically of the order of 7 nm) does not make it possible to directly produce a contact on an FDSOI substrate for this type of transistor.

U.S. application patent Ser. No. 15/041,593 filed Feb. 11, 2016 (corresponding to French Application for Patent No. 1556515), incorporated by reference, describes means that make it possible to produce a substrate contact by the use of additional junction-free transistor(s) as connection element(s). Although satisfactory, this solution can however, in some cases, generate spurious effects and offers an integration density which can prove limited in certain applications.

SUMMARY

Thus, according to one implementation and embodiment, it is proposed to provide a substrate contact for a transistor produced in a substrate of SOI type, in particular of FDSOI type, resulting in reduced spurious effects, notably because of a more compact geometry.

According to one aspect, there is proposed a method for producing at least one substrate contact for an MOS transistor produced in and on an active zone of a substrate of silicon on insulator type, comprising:

formation on top of the active zone of a gate region of the transistor having a rectilinear part situated between the source and drain regions of the transistor and extended by at least one first forked part, formation of at least one first raised semiconductive region above the active zone and at least partly within said first forked part, and formation of said at least one substrate contact electrically coupled to, for example on, said at least one first raised semiconductive region.

The substrate contact is electrically coupled to the first raised semiconductive region in as much as it can for example be directly formed on the raised semiconductive region, or possibly on the gate region if the forked part of the gate region is in electrical contact with the raised semiconductive region.

In other words, the production of a junction-free transistor is dispensed with by producing a contact electrically coupled to the raised silicon region. The forked part of the gate notably serves as mask which makes it possible to simplify the delimiting and the production of the raised silicon region.

The distance between the contact and the substrate is reduced, which makes it possible on the one hand to reduce the spurious capacitive effects between these elements and, on the other hand, to reduce the substrate access resistance.

According to one implementation, the formation of said gate region further comprises a formation of a second forked part extending said rectilinear part opposite the first forked part, the method further comprising: formation of a second raised semiconductive region above the active zone and at least partly within said second forked part, and formation of a second substrate contact for the first transistor electrically coupled to, for example on, said second raised semiconductive region.

The formation of each raised semiconductive region can comprise an epitaxy of a semiconductive material.

According to one implementation, the formation of at least one substrate contact is performed on the corresponding raised semiconductive region.

As a variant, at least one raised semiconductive region is in contact with at least one forked part of the gate region and the formation of at least one substrate contact is performed on said gate region.

According to another aspect, an integrated electronic device is proposed that comprises a semiconductive film, for example fully depleted, above a buried insulating layer, which is itself situated above a supporting substrate, an active zone produced within the semiconductive film, at least one first MOS transistor produced in and on the active zone and comprising a gate region produced above the active zone and having a rectilinear part situated between the source and drain regions and extended by at least one first forked part, at least one first raised semiconductive region situated above the active zone and at least partly within said first forked part, and at least one first substrate contact for the first transistor electrically coupled to, for example on, said first raised semiconductive region.

According to one embodiment of this aspect, the gate region comprises a second forked part extending said rectilinear part opposite the first forked part, the device further comprising a second raised semiconductive region situated above the active zone and at least partly within said second forked part, and a second substrate contact for the first transistor electrically coupled to, for example on, said second raised semiconductive region.

Each forked part can comprise an extension extending at right angles on either side of the rectilinear part out of the source and drain regions, a first branch connected to said extension and extending in the extension of the source region and a second branch connected to said extension and extending in the extension of the drain region, and each raised semiconductive region can extend at least partly between the corresponding first branch and second branch.

According to one embodiment, the device can comprise, within the supporting substrate, a semiconductive well situated under said active zone, and a well contact intended to bias said well.

According to one embodiment, the device can comprise a number of MOS transistors of which the rectilinear gate parts are parallel and mutually electrically connected via their forked part, so that all of the extensions of the transistors form a single line of gate material at right angles to each rectilinear gate part and from which extend said corresponding branches.

Two neighboring transistors can have their source regions or their drain regions in common.

According to one embodiment, at least one substrate contact is situated on the corresponding raised semiconductive region.

As a variant, at least one raised semiconductive region is in contact with at least one forked part of the gate region and at least one substrate contact is situated on said gate region.

BRIEF DESCRIPTION OF THE DRAWINGS

Other advantages and features of the invention will become apparent on studying the detailed description of non-limiting embodiments, and the attached drawings in which:

FIGS. 1 to 7 illustrate embodiments of a substrate contact for a transistor.

DETAILED DESCRIPTION

Figure 4:
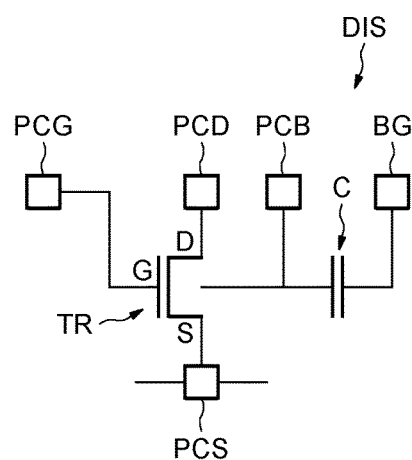

FIG. 1 illustrates a plan view of an integrated device DIS according to one embodiment, for which FIGS. 2 and 3 are cross-sectional views along the lines II-II and III-III of FIG. 1.

The device DIS comprises a substrate of fully depleted silicon on insulator (FDSOI) type (FDSOI being an acronym well known to those skilled in the art), which comprises a semiconductive film 1 situated above a buried insulating layer 2 ("BOX", Buried Oxide), which is itself situated above a supporting substrate comprising a semiconductive well 3.

The well is here of P type and comprises an upper zone 30 (in contact with the BOX) of P+ type which forms a rear buried gate making it possible to bias the channel of a transistor TR via the rear face. In this respect, the device DIS further comprises a back gate contact BG making it possible to bias the well 3.

An insulating region 4, of shallow trench insulation (STI) type delimits an active zone ZA in the semiconductive film 1.

The semiconductive film 1 comprises a fully depleted semiconductive material which in practice is an intrinsic material, for example intrinsic silicon of P type, that is to say very weakly doped ($10^{15}$ atoms·cm$^{-3}$).

An MOS transistor TR, for example an NMOS transistor, is produced in and on the active zone ZA.

This transistor TR comprises source S and drain D semiconductive regions, doped of N+ type, an insulated gate region G and a channel region 8 adapted to be formed under the gate.

The insulated gate region G comprises a rectilinear part G1 produced above the channel region 8, and a forked part G2 having an extension G20 extending at right angles on either side of the gate line G1.

The forked part G2 further comprises a first branch G21 and a second branch G22 extending from the extension G20 in the extension of the source S and drain D regions.

The reference B denotes the substrate of the transistor TR.

According to a conventional embodiment in substrates of FDSOI type, the drain D and source S regions are produced in a raised fashion by epitaxial rework (i.e., growth), in order to allow for the contacts.

The semiconductive film further comprises a doped region of P+ type on which has been produced a raised silicon region 5 by epitaxial rework. The biasing of this region makes it possible to bias the substrate 1 of the transistor TR.

This raised region 5, here of P type, is produced between the first branch G21 and the second branch G22.

Here, the first branch G21 and the second branch G22 allow for a greater accuracy in the production of the region 5 because they delimit the epitaxied region.

Zones of metal silicide are, in this example, produced respectively on the gate G, drain D and source S regions, and on the region 5, and respectively allow for the gate PCG, drain PCD, source PCS and substrate PCB contacts.

The gate contacts are here produced on the branches G21 and G22 of the forked part G2 of the gate region G, via the metal silicide zone.

The device DIS therefore comprises the transistor TR situated in and on a substrate of FDSOI type comprising a substrate contact produced simply and accurately by epitaxial rework and siliciding. Thus, the contact is close to the substrate of the transistor which makes it possible to reduce the spurious capacitive effects and the substrate access resistance.

FIG. 4 illustrates a schematic representation of the device from an electrical point of view.

Represented therein are the transistor TR, comprising its drain D, source S and gate G regions, the contacts PCS, PCD, PCG and PCB, and the contact of the well BG.

A capacitor C schematically represents the capacitor formed under the transistor TR by the semiconductive film 1, the insulating layer 2 and the well 3.

The gate contacts situated on each of the branches G21 and G22 are represented by one and the same contact PCG.

Such a device notably makes it possible to obtain a very significant current gain, of the order of $10^5$.

Figure 5:
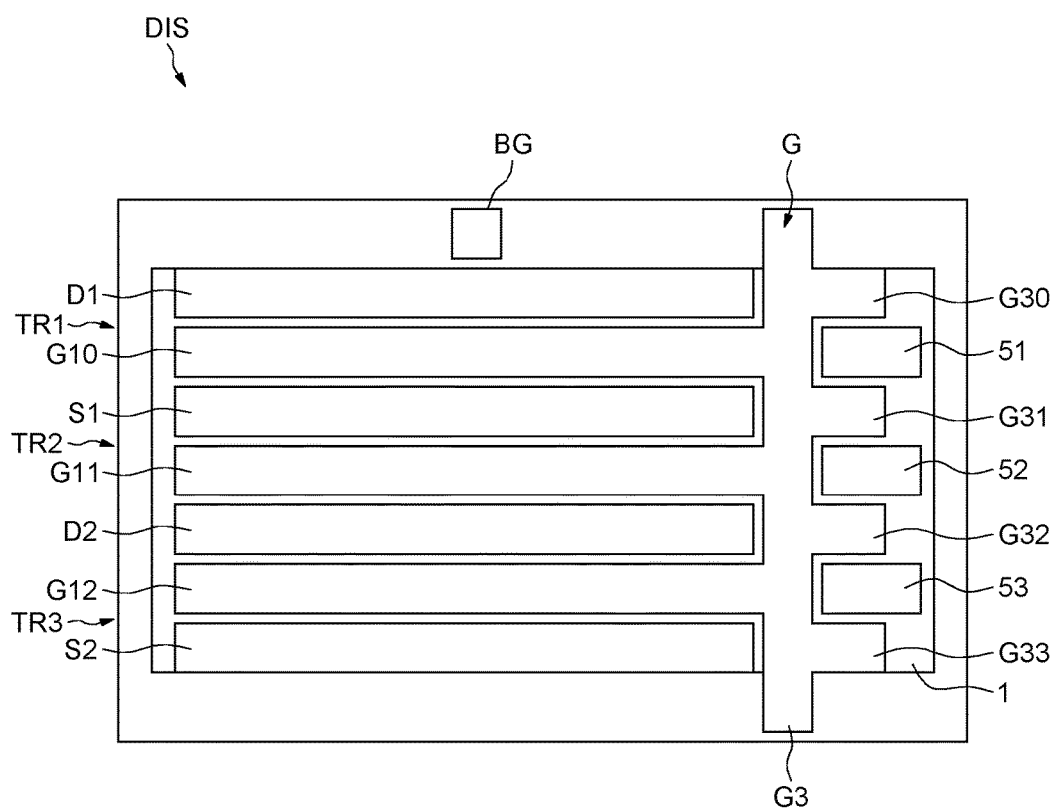

FIG. 5 illustrates an embodiment in which the device DIS comprises a number of analog MOS transistors TR1, TR2 and TR3 similar to that described previously and illustrated in FIGS. 1 to 4.

The three transistors (the number three not being limiting) are produced in and on the same silicon film 1, and their gates are mutually electrically connected via the extension of their respective forked part.

The device can therefore be considered as having a common gate G, comprising 3 rectilinear gate parts G10, G11 and G12, and an extension G3 at right angles to the three gate lines from which extend a number of branches G30, G31, G32 and G33 in the extension of the source and drain regions of each transistor.

Here, each transistor is produced in such a way as to have its source region and/or its drain region in common with the neighboring transistor.

Thus, the transistor TR1 comprises the first rectilinear part G10 and the source and drain regions D1 and S1, the transistor TR2 comprises the second rectilinear part G11 and the source and drain regions S1 and D2, and the third transistor TR3 comprises the third rectilinear part G12 and the source and drain regions D2 and S2.

Each transistor TR1, TR2 or TR3 also comprises a raised region 51, 52 or 53 in the extension of its gate, between the branches of its forked part, and on which is produced a zone of metal silicide (not represented) allowing for a substrate contact.

The device also comprises a well contact BG making it possible to bias the well common to each transistor via the rear face. Given that the wells of the transistors TR1, TR2 and TR3 are common, the contact BG makes it possible to bias each of the transistors via its rear face.

The production of the substrate contacts on the raised silicon regions makes it possible to obtain a more compact structure.

The inventors have notably observed that, by comparison to a structure that is functionally equivalent but whose substrate contacts are produced by additional transistors such as those described in the U.S. application Ser. No. 15/041,593 (French Appl. No. 1556515), a reduction of the surface area of the imprint of the circuit is obtained that is of the order of 30%.

That is notably due, in the case where the contacts are made by additional transistors to the need to produce isolation trenches between each transistor used to take the substrate contact in order to reduce the spurious effects.

Figure 6:
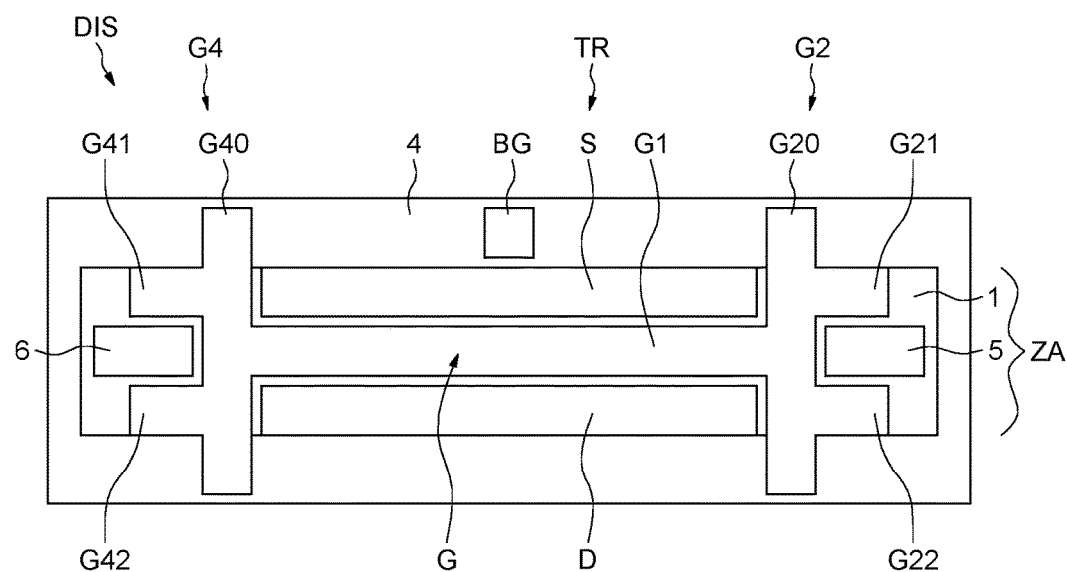

FIG. 6 illustrates an embodiment in which the MOS transistor TR comprises a second forked part G4, opposite the first forked part G2, comprising a second extension G40 which extends at right angles on either side of the rectilinear gate part G1.

The second forked part G4 further comprises a third branch G41 and a fourth branch G42 extending from the second extension G40 in the extension of the source and drain regions S and D.

A second additional raised silicon region 6 has also been produced above the silicon film 1, between the third branch G41 and the fourth branch G42, by epitaxial rework. The biasing of this region allows for a second substrate contact PCB2 and therefore makes it possible to bias the substrate B of the transistor TR.

Thus, the device comprises two forked parts G2 and G4 and two substrate contacts PCB and PCB2 produced symmetrically on either side of the transistor TR.

The addition of this second substrate contact PCB2 makes it possible to more effectively bias the substrate B of the transistor TR.

Figure 7:
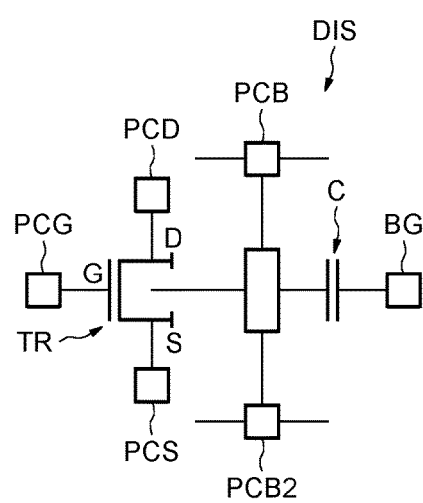

Furthermore, as illustrated in FIG. 7, the device can be considered functionally as an MOS transistor T with four gates, also known to those skilled in the art by the designation "G⁴-FET", and comprising 6 contacts.

In this mode of operation, the two contacts PCB and PCB2 are used as the electrodes of the transistor T. For example, the first contact PCB corresponds to the source and the second contact PCB2 corresponds to the drain.

The source S and the drain D of the transistor TR are used as two gates of a P-channel JFET transistor. They can therefore here be biased in order to modulate the current flowing between the source PCB and the drain PCB2 of the transistor T.

The gate G and the rear gate of the transistor TR, linked respectively to the contacts PCG and BG, can also be biased in order to modulate the current, and also the resistance value R of the substrate B. These two gates form the other two gates of the four-gate transistor T.

It should be noted that the embodiments presented here are in no way limiting.

More specifically in the devices described previously, the forked parts and the raised regions 5, 51, 52, 53, 6 are separated by a thin space and mutually electrically insulated for example by insulating spacers (not represented in the interests of clarity of the figures) situated on the flanks of the forked parts.

This makes it possible to have different contacts for the gate and the substrate. It then becomes possible to have particular embodiments as described in U.S. Pat. No. 9,019,666.

More specifically, it is possible to connect a first resistive element between the source and the substrate of the MOS transistor and a second resistive element between the gate and the source of the MOS transistor, the gate and the substrate of the transistor not being connected together.

A combined bipolar and MOS effect is then obtained through the drain-substrate capacitances and through the drain-gate capacitances. That said, this combined effect is not amplified because of the absence of connection between the substrate and the gate of the transistor.

It would also be possible, in the context of a reversible operation, to leave the substrate and the gate of the MOS transistor floating. The bipolar and MOS effect is then obtained by the capacitive gate-substrate coupling.

So as to have an amplified effect, it is possible to electrically link the gate and the substrate of the transistor, and also advantageously provide for a resistor to be connected between the gate and the ground, the value of which can be adjusted to raise the value of the trigger threshold of the device, as explained in U.S. Pat. No. 9,019,666.

In this respect, it would be perfectly possible to envisage having the forked parts and said raised regions in contact, which amounts to electrically connecting the substrate B and the gate G of the transistor TR by having only a single contact situated for example on the gate region.

Furthermore, in the embodiment illustrated in FIG. 5, it would be possible to equip each transistor with a second forked part and a second substrate contact, as illustrated in FIG. 6.

The invention claimed is:

1. A method for producing at least one substrate contact for an MOS transistor produced in and on an active zone of a substrate of silicon on insulator type, comprising:
    forming on top of the active zone a gate region of the transistor having a rectilinear part situated between source and drain regions of the transistor and extended by a first forked part which includes a first part extending perpendicular to the rectilinear part over a portion of the semiconductor film where the source and drain regions are not present, a second part extending perpendicular to the first part, and a third part extending perpendicular to the first part and spaced apart from said second part;
    forming at least one first raised semiconductive region above the active zone and at least partly positioned between the second and third parts of said first forked part; and
    forming said at least one substrate contact electrically coupled to said at least one first raised semiconductive region.

2. The method according to claim 1, wherein forming the gate region further comprises forming a second forked part extending said rectilinear part opposite the first forked part, the second forked part including a fourth part extending perpendicular to the rectilinear part over a further portion of the semiconductor film where the source and drain regions are not present, a fifth part extending perpendicular to the fourth part, and a sixth part extending perpendicular to the fourth part and spaced apart from said fifth part, the method further comprising:

forming a second raised semiconductive region above the active zone and at least partly positioned between the fifth and sixth parts of said second forked part; and forming a second substrate contact for the first transistor electrically coupled to said second raised semiconductive region.

3. The method according to claim 1, wherein forming the at least one first raised semiconductive region comprises epitaxially growing a semiconductive material.

4. The method according to claim 1, wherein forming said at least one substrate contact is performed on the at least one first raised semiconductive region.

5. An integrated electronic device, comprising:
a semiconductive film above a buried insulating layer which is situated above a supporting substrate,
an active zone within the semiconductive film,
at least one first MOS transistor produced in and on the active zone and comprising a gate region situated above the active zone, the gate region having a rectilinear part situated between source and drain regions, and at least one first forked part which extends the rectilinear part and includes a first part extending perpendicular to the rectilinear part over a portion of the semiconductor film where the source and drain regions are not present, a second part extending perpendicular to the first part, and a third part extending perpendicular to the first part and spaced apart from said second part,
at least one first raised semiconductive region situated above the active zone and at least partly positioned between the second and third parts of said first forked part, and
at least one first substrate contact for the first transistor electrically coupled to said first raised semiconductive region.

6. The device according to claim 5, wherein the gate region comprises a second forked part extending said rectilinear part opposite the first forked part and including a fourth part extending perpendicular to the rectilinear part over a further portion of the semiconductor film where the source and drain regions are not present, a fifth part extending perpendicular to the fourth part, and a sixth part extending perpendicular to the fourth part and spaced apart from said fifth part, further comprising:
a second raised semiconductive region situated above the active zone and at least partly positioned between the fifth and sixth parts of said second forked part, and
a second substrate contact for the first transistor electrically coupled to said second raised region.

7. The device according to claim 5, further comprising, within the supporting substrate, a semiconductive well situated under said active part and a well contact for biasing of said well.

8. The device according to claim 5, wherein the at least one substrate contact is situated on the first raised semiconductive region.

9. The device according to claim 5, wherein the semiconductive film is fully depleted.

10. An integrated electronic device, comprising:
a semiconductive film above a buried insulating layer which is situated above a supporting substrate,
an active zone within the semiconductive film,
at least one first MOS transistor produced in and on the active zone and comprising a gate region situated above the active zone, the gate region having a rectilinear part situated between source and drain regions, and at least one first forked part which extends the rectilinear part, wherein the forked part comprises:
an extension extending at right angles on either side of the rectilinear part out of the source and drain regions,
a first branch connected to said extension and extending in the extension of the source region, and
a second branch connected to said extension and extending in the extension of the drain region,
at least one first raised semiconductive region situated above the active zone, wherein the at least one first raised semiconductive region extends at least partly between the first branch and second branch, and
at least one first substrate contact for the first transistor electrically coupled to said first raised semiconductive region.

11. The device according to claim 10, further comprising a number of MOS transistors having rectilinear parts extending in parallel and being mutually electrically connected via the at least one forked part.

12. The device according to claim 11, wherein said extension forms a single line of gate material at a right angle to each rectilinear part.

13. The device according to claim 11, wherein neighboring transistors have one of a source region or a drain region in common.

14. A device, comprising:
a semiconductive film above a buried insulating layer which is situated above a supporting substrate,
an active zone within the semiconductive film including an elongated source region, an elongated drain region extending in parallel with the elongate source region and a channel region between the elongated source and drain regions,
a gate region comprising:
a first rectilinear part extending over the channel region parallel to the elongated source and drain regions,
a second rectilinear part extending perpendicular to the first rectilinear part over a portion of the semiconductor film where the elongated source and drain regions are not present,
a third rectilinear part extending perpendicular to the second rectilinear part over said portion of the semiconductor film, and
a fourth rectilinear part extending perpendicular to the second rectilinear part over said portion of the semiconductor film and spaced apart from said third rectilinear part,
an epitaxial region on said portion of the semiconductor film and located between the third and fourth rectilinear parts, and
a substrate contact for the transistor electrically coupled to said epitaxial region.

15. The device of claim 14, further comprising:
a doped well in the supporting substrate underneath the active zone; and
means for biasing said doped well.

16. The device of claim 14, wherein said gate region further comprises:
a fifth rectilinear part extending perpendicular to the first rectilinear part over a further portion of the semiconductor film where the elongated source and drain regions are not present,
wherein said portion of the semiconductor film and said further portion of the semiconductor film are at opposite ends of the elongated source and drain regions, a sixth rectilinear part extending perpendicular to the fifth rectilinear part over said further portion of the semiconductor film, and a seventh rectilinear part extending perpendicular to the fifth rectilinear part over said further portion of the semiconductor film and spaced apart from said sixth rectilinear part, and further comprising:

a further epitaxial region on said further portion of the semiconductor film and located between the sixth and seventh rectilinear parts, and a further substrate contact for the transistor electrically coupled to said further epitaxial region.

17. The device of claim 14, wherein said gate region further comprises:

a fifth rectilinear part extending perpendicular to the second rectilinear part over said portion of the semiconductor film and spaced apart from said fourth rectilinear part, further comprising:

a further epitaxial region on said portion of the semiconductor film and located between the fourth and fifth rectilinear parts, and a further substrate contact for the transistor electrically coupled to said further epitaxial region.

* * * * *